United States Patent [19]

Wendt

[11] Patent Number: 4,467,472
[45] Date of Patent: Aug. 21, 1984

[54] DIPLEXER FOR THE SEPARATION OF A SIGNAL AND OF A SUPPLY CURRENT

[75] Inventor: Peter Wendt, Munich, Fed. Rep. of Germany

[73] Assignee: Siemens Aktiengesellschaft, Berlin & Munich, Fed. Rep. of Germany

[21] Appl. No.: 379,260

[22] Filed: May 17, 1982

[30] Foreign Application Priority Data

Jun. 3, 1981 [DE] Fed. Rep. of Germany ....... 3122084

[51] Int. Cl.³ .............................................. H03F 1/00
[52] U.S. Cl. .................... 370/97; 179/170 J; 330/56
[58] Field of Search ...................... 370/97, 37; 375/4; 455/14; 179/170 J; 307/2, 3; 330/56, 286, 11, 165, 166

[56] References Cited

U.S. PATENT DOCUMENTS

| 3,530,393 | 9/1970 | Thatch | 330/56 |
| 4,114,107 | 9/1978 | Bauch et al. | 330/56 |
| 4,170,761 | 10/1979 | Koppehele | 330/56 |
| 4,208,633 | 6/1980 | Krause | 330/56 |

FOREIGN PATENT DOCUMENTS

1272466 7/1968 Fed. Rep. of Germany.
341002 5/1977 Fed. Rep. of Germany.

OTHER PUBLICATIONS

"Power Separating Filters for Dependent Carrier-Frequency Repeaters", Frequenz (1974).

Primary Examiner—Douglas W. Olms
Attorney, Agent, or Firm—Hill, Van Santen, Steadman & Simpson

[57] ABSTRACT

A diplexer is disclosed for use in remotely fed intermediate regenerators or repeaters of broad-band transmission systems with coaxial cable sections. The diplexer has a high circulating attenuation at high frequencies. Since sections of the regenerator are at a remote feed potential and are connected to the inner conductor of the feed cable, a plurality of high-voltage stable feed-through capacitors as well as line inductors are required for decoupling the regenerator from noise voltages. In view of a lower expense and simpler structure, a diplexer is provided according to the invention which, at its carrier body, contains a tubular body with a material having a high dielectric constant and corresponding dielectric strength. The stripped feed cable is conducted through its free inside diameter, said tubular body being continuously metallized on the inside and by sections on the outside. It also contains ferrite rings at the outside at sections of the outer tubular body which are free of the metallization. The invention is particularly useful in PCM systems with transmission rates above 500 Mbit/s.

14 Claims, 3 Drawing Figures

DIPLEXER FOR THE SEPARATION OF A SIGNAL AND OF A SUPPLY CURRENT

BACKGROUND OF THE INVENTION

The invention relates to a diplexer for separating a signal current and a supply current. Such a system is used in remotely fed intermediate regenerators or repeaters of broad-band transmission systems with coaxial cable paths. Such systems exhibit a high circulating atenuation at high frequencies. They are provided with an input or output side inductor arrangement for the power supply and a capacitor which connects one of the two power supply terminals of the regenerator or repeater to its reference potential.

A diplexer of the type initially cited is known from German LP No. 12 72 466, incorporated herein by reference. It consists of high and low pass filters connected in series, and is particularly employed for the power supply of remotely fed line repeaters of broadband carrier frequency systems. They are constructed with the use of coaxial inductors. Given these coaxial inductors, the two windings offer very little resistance to the signal current traversing in the opposite direction, whereas they offer a very high resistance to the noise currents respectively traversing only one winding. Capacitors which exhibit a noticeable inductance at high frequencies are provided for the connection between the reference potential of the repeater and the grounded potential of the outer inductor of the coaxial cable. This inductance vitiates the coupling effect of the capacitor. It results from the lead inductance of the capacitor and the structure caused by the high voltage di-electric strength and therefore cannot be reduced as desired without further efforts. Due to the deteriorated connection of the two grounded potentials, a deterioration of the circulating attenuation also results, i.e. an increased feedback of the output signal of the repeater to its input. The term "circulating attenuation" describes the attenuation between the output side pair of posts and the input side pair of posts. In this case, the circulating attenuation is again increased by means of additionally provided line inductors. However, a further limit derives due to the disruptive leakage inductance of the line inductors occurring at higher inductances.

A further such arrangement is known from the periodical "Frequenz" 28, 1974, Pages 326–333, particularly FIG. 15, incorporated herein by reference, in which ferrite rings and high voltage capacitors are applied in succession on a coaxial cable and the entire arrangement is surrounded by a tubular housing having a conductive connection. Upon employment of coaxial cables, however, an involved and difficult contacting of the capacitors to the inner wall of the tubular housing and to the outer conductor of the coaxial cable results. In view of the high signal frequencies, the proposed contacting by means of springs cannot be employed. Also, a particularly high-grade shielding is required given the cable piece connected to the capacitors and ferrite rings.

A remotely fed intermediate repeater, particularly for coaxial message transmission links disposed between an input side and an output side line connected to one another over an outer conductor connection, is known from U.S. Pat. No. 4,114,107, incorporated herein by reference. In this system, the outer conductor connection and a feed voltage terminal are capacitively connected. The feed voltage terminal also has an alternating voltage-wise reference potential at the same time. In this arrangement, at least one capacitor is provided between the grounded potential of the outer conductor of the coaxial cable and the reference potential of the intermediate repeater. Accordingly, problems concerning the coupling of the input circuit and output circuit over the grounded connections result at higher frequencies. In order to increase the circulating attenuation, the repeater is sub-divided into at least two sub-repeaters whereby the two sub-repeaters are decoupled over a respective capacitor lying between the reference potential of the sub-repeater and the outer conductor potential of the coaxial cable. Moreover, the feed voltage inputs of the sub-repeaters are decoupled from one another in high frequency-wise fashion. In order to increase the circulating attenuation, a line inductor is additionally provided which transmits the useful signal from the input to the output sub-repeater and thereby suppresses noise signals. However, a sure suppression of the noise signals only results when the passage through the outer chamber partition between the two sub-repeaters (the outer chamber partition having the potential of the outer conductor of the cable), has a high capacitance, i.e. is designed as a high voltage stable feed-through capacitor. As a result of these additional feed-through capacitors which are to be provided for each line connection between the two sub-repeaters, however, a high expense results overall given an involved mechanical structure of the repeater arrangement at the same time. Also, due to the parallel connection of the individual line inductors, a reduction of the effective inductance again results overall and thus a reduction of the circulating attenuation occurs. The coupling between the two repeater or generator parts occurs over lines which proceed in a field-filled space so that the possibility of disruptions being scattered-in exists on the one hand, and on the other hand, the required all-around shielding has an influence on the repeater or regenerator properties.

SUMMARY OF THE INVENTION

It is an object of the invention to provide a problem free connection between the individual components with a simple mechanical structure. High protection against external disruptions must be guaranteed, along with a high circulating attenuation up to approximately 140 decibels, and up to frequencies of approximately 800 MHz. No significant change of the function of the diplexer must occur.

These objects are achieved by providing a homogeneous line with an intrinsic impedance corresponding to that of the connection cable. The inner and outer conductors of the line are connected at the one side to the corresponding conductors of the connection cable. Its inner conductor on the other side is connected to a signal terminal of the regenerator or repeater if need be through a capacitor. The outer conductor of the homogeneous line is connected at the connection location to the connection cable in as low resistance a manner as possible, and is at least capacitively connected at its end to the inner conductor of an inhomogeneous line. Sections of very low or high intrinsic impedance in comparison to the connection cables alternate in the inhomogeneous line. The terminal of the outer conductor of the inhomogeneous line adjacent to the connecting cable has a conductive connection to a shielding. The other terminal of the outer conductor is connected to the reference potential of the regenerator or repeater.

In addition to the advantage of the comparatively low expense, the inventive diplexer also offers the advantage of relatively small dimensions. This has a significant influence on the electrical properties achieved in view of the required gap-free shielding and low parasitic impedances.

A further development of the inventive diplexer which is advantageous because of its simple structure results by forming the homogeneous line by a part of the connecting cable. By so doing, possible discontinuities are avoided on the one hand, and on the other hand, a structure which is correspondingly simpler is achieved.

Given an overall structure of the arrangement in stripline form, a variation of the invention is possible in which the homogeneous line is formed by a stripline arrangement.

An advantageously simple structure results given employment of a tubular body as the mechanical carrier. The inhomogeneous line is formed by a high voltage stable tubular body through which the homogeneous line is conducted. The tubular body is shaped of a material with a high dielectric constant. The tubular body exhibits a through-connection metallization on the inside which represents the inner conductor of the inhomogeneous line. The tubular body exhibits an outer metallization which is interrupted by at least one ferrite ring and which represents the outer conductor of the low-resistance sections of the inhomogeneous line. A shielding housing having a conductive connection to the outer conductor of the low-resistance sections is provided surrounding the tubular body circumferentially over at least a part of its length. This shielding housing represents the outer conductor of the high-resistance sections of the inhomogeneous line. It is a particular advantage that the cable piece conducted through the tubular body need not exhibit a particularly tight shielding.

DESCRIPTION OF THE PREFERRED EMBODIMENTS

Figure 1:
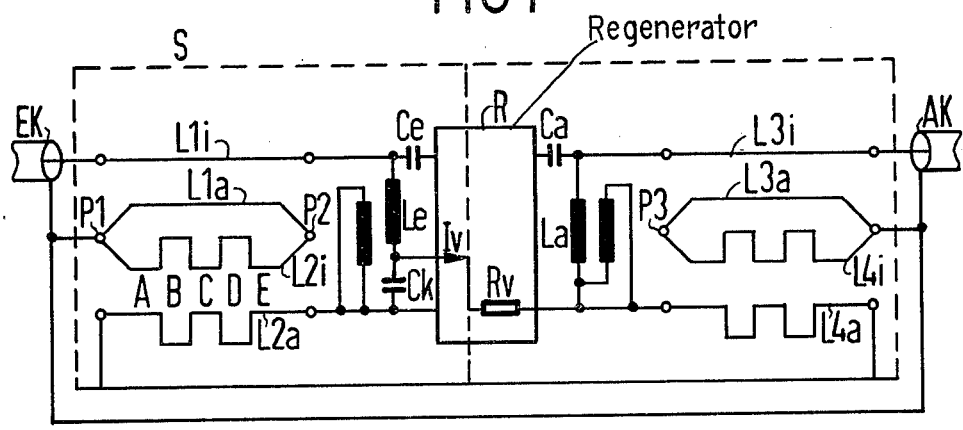
FIG. 1 is a schematic diagram of a regenerator for digital signals with an input and output diplexer.

A regenerator arrangement with the diplexers disposed between the input side connection cable EK and the output connection cable AK is shown in FIG. 1. A section of the input connection cable which is designed as a coaxial cable forms the first homogeneous line L1 whose inner conductor L1i is connnected at the cable end to one terminal of an input capacitor Ce and and input-side current supply inductor Le. The cable piece functioning as the homogeneous line L1 is passed through a tubular body illustrated in greater detail in FIG. 3 and is connected in as low-resistance a manner as possible to its inner metallization at the cable side by means of a solderless connector at point P1 illustrated in the drawing. At the regenerator side end of the tubular body, the connection between the outer conductor L1a of the coaxial cable and the inside metallization of the tubular body L2i is non-positively locked at point P2. A particularly low-resistance connection is not required at point P2. A capacitive connection suffices, this being significantly easier to manufacture inside the tubular body than a solder connection.

At its outside, the tubular body 12 carries a metallization at some locations and ferrite rings at others. Overall, there results an inhomogeneous line L2 with relatively very low-resistance line pieces and high-resistance line pieces in comparison to the intrinsic impedance of the connection cable. The tubular body is embedded in a shielding housing, which, together with the outer metallizations of the tubular body, represents the outer conductor L2a of the inhomogeneous line. The outer conductor is connected to the housing shielding at a location adjacent to point P1. At a location adjacent to point P2, the outer conductor is connected to the ground terminal of the regenerator R and thus is connected to a decoupling capacitor Ck which connects one of the two current supply terminals of the regenerator R to its reference potential. The input-side inductor arrangement Le for the power supply is constructed by means of a coaxial line. At its one side, the inner conductor of the line is connected to the inner conductor L1i of the homogeneous line at its end at the regenerator side. Moreover, the inner conductor of the cable forming the inductor arrangement Le is connected at its other end to a power supply terminal of the regenerator R. The outer conductor of the inductor arrangement Le is connected at both sides to the ground point of the regenerator R.

The regenerator R receives the digital signals to be regenerated over the input capacitor Ce and emits the signals to the output-side diplexer over the output capacitor Ca. The path for the supply current Iv is indicated in the regenerator, the path flowing through the load resistor Rv to the other current supply terminal of the regenerator R and over an output-side inductor arrangement La to the inner conductor of the output-side connection cable. The outer conductors of the input-side and of the output-side cables Ek, Ak are directly connected to one another. Structurally, the output-side diplexer with a further homogeneous line L3 and a further inhomogeneous line L4 completely corresponds to that of the input-side diplexer, so that its detailed description is superfluous.

The received digital signals proceed from the inner conductor L1i over the input capacitor Ce to the regenerator R. The supply current is branched off from the inner conductor L1i over the inductor and proceeds to the current supply terminal of the regenerator. After the regeneration of the digital signal, this is amplified in the transmission stage to the level necessary for bridging the next regenerator field and is emitted to the next transmission cable section. By use of a current control in the regenerator R, the output capacitor Ca can be eliminated.

It is further expedient for the shielding to sub-divide the regenerator housing in two housing parts placed at regenerator potential, whereby the transmission signal has a low level in the left housing part and a high level in the right housing part. Accordingly, the connection between the two housing chambers can, however, ensue directly, i.e. without employment of a line inductor and likewise without employment of high-voltage-stable feed-through capacitors. Although input-side noise currents continue to arise due to an undesired feedback between the output part of the regenerator and its input part, the noise currents flow over the point P1 into the inhomogeneous line L2 effective as a "wave sink" with its sections A, B, C, D, E of greatly different intrinsic impedance. However, an attenuation of the noise currents extending up to the limits of measuring precision results therfrom.

Due to the output-side diplexer with its inhomogeneous line L4, a significant attenuation of the fed-back noise voltages additionally ensues, said noise voltages having their maximum amplitude at point P3, i.e., at the input of the further inhomogeneous line L4.

From the further current supply terminal of the regenerator R, the supply current proceeds over the output-side inductor arrangement La to the inner conductor L3i of the further homogeneous line L3, and thus to the inner conductor of the output-side connection cable. By means of a coaxial line, the output-side inductor arrangement La is likewise constructed as a stripline.

Figure 2:
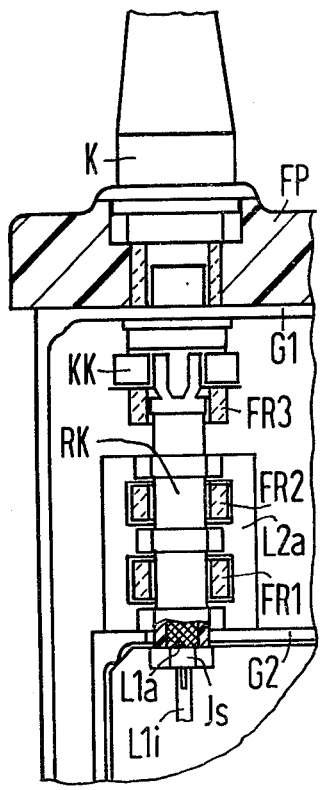
FIG. 2 illustrates the structural design of an essential part of the inventive diplexer.

In FIG. 2, the structural design of a regenerator input part together with the cable muff or covering K is illustrated. The cable covering K is inserted into a front plate FP which is secured to the outer regenerator housing G1. A cable pot head is inserted through a bore of the front plate and of the regenerator housing G1 and extends into the inner regenerator housing G2 with its shielding mesh which corresponds to the outer conductor L1a of the first homogeneous line. The cable is secured to the inside of the outer regenerator housing G1 with a cable clamp KK. A tubular body RK is inserted over the cable between the two regenerator housings G1 and G2, said tubular body RK being continuously metallized on the inside whereas it contains metallized rings alternating with slipped-on ferrite rings on its outside. The overall tubular body RK is circumferentially surrounded by a housing which is in conductive contact with the outer metallizations and, together with these, represents the outer conductor L2a of the inhomogeneous line. A third ferrite ring is inserted over a free piece of the cable between the cable clamp KK and the tubular body RK, said third ferrite ring functioning as a line inductor and effecting an attenuation of noise voltages in-coming over the outer cable conductor. The part of the cable projecting into the inner regenerator housing consists of a piece of a cable insulation is as a voltage protection and of the inner coaxial cable conductor L1i to which the regenerator input is connected over an input capacitor.

Figure 3:
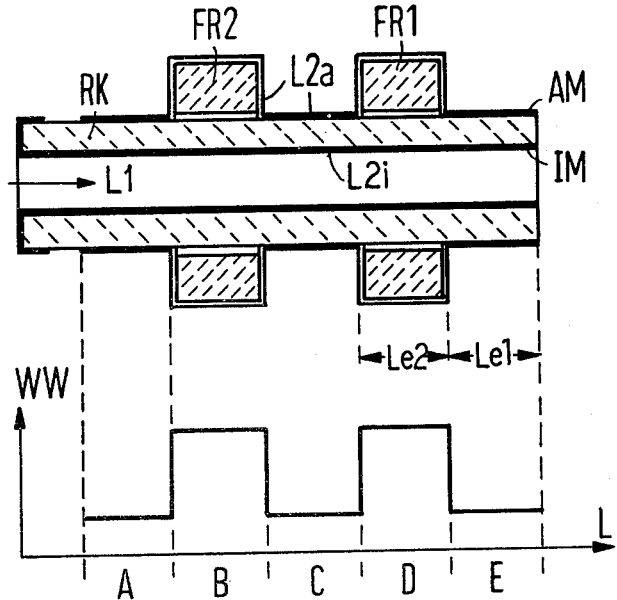
FIG. 3 illustrates a sectional view through the inventive diplexer inhomogeneous line together with a corresponding graph of impedance variations therein.

A section through the tubular body RK and, in addition, the profile of the intrinsic impedance WW along the tubular body are illustrated in FIG. 3. The free inside diameter of the tubular body corresponds to the outer diameter of the stripped connection cable, so that its shielding mesh contacts the inner metallization IM of the tubular body in a large-surface manner. Also, at the one side corresponding to the point P1, the shielding mesh of the coaxial cable and the inner metallization of the tubular body are connected in highly conductive fashion. Two ferrite rings FR1, Fr2 are slipped over the tubular body. The tubular body is provided with an outer metallization AM at its circumferential surfaces which are free of said ferrite rings. A housing L2a which is conductively connected to the respective outer metallization surfaces is inserted over the circumference of the tubular body. Illustrated below the tubular body is the curve of the intrinsic impedance WW, whereby the individual sections A, B, C, D, and E are clearly delineated. It turns out that the intrinsic impedance at those circumferential surfaces of the tubular body which are provided with an outer metallization A, C, E, decreases to a very low value of approximately 0.5Ω, whereas it increases over the intrinsic impedance of the coaxial cable of approximately 75Ω to an intrinsic impedance of approximately 100Ω at the circumferential surfaces B and D surrounded by the ferrite rings. It is not necessary in order to achieve an optimum attenuation of the noise voltages to select the length Le1 of the metallized sections and that of the sections Le2 surrounded by the ferrite rings of equal sizes. A change of the respective intrinsic impedance as well as of the attenuation in the sections B and D is possible by means of employing a different ferrite. A further change is possible by means of employing a different tubular body with a different di-electric constant and a different loss factor. The lengths Le1 and Le2 of the individual sections lie at 6—8 mm, so that an overall length of the tubular body of approximately 40 mm results. With measurements agreeing with the calculations, greatly attenuated resonant frequencies result of approximately 400 and approximately 800 MHz corresponding to the low-resistance or respectively to the high-resistance tubular body sections derived for the sample embodiment. Accordingly, the length Le1 of an individual metallization section was selected in view of the resulting resonant frequency. This should fall into a frequency range in which the transmission signal has only a slight energy component. The overall length of the outer metallization as a sum of the lengths Le1 determines the lower cut-off frequency of the diplexer as a result of the sum capacitance resulting at low frequencies and as a result of the effective inductances, particularly of the sections Le2. The lower cut-off frequency of the diplexer resulting due to the overall length of the outer metallization corresponds to the lower cut-off frequency of the digital signals to be transmitted. The length Le2 of the section free of outer metallization (this section corresponds approxiamtely to the height of the ferrite ring slipped on at this location), was selected in such a manner that the resulting resonant frequency lies at approximately 800 MHz, i.e. at twice the resonant frequency of the low-resistance sections.

Although various changes and modifications might be proposed by those skilled in the art, it will be understood that I wish to include within the claims of the patent warranted hereon all such changes and modifications as resonably come within my contribution to the art.

I claim as my invention:

1. A diplexer for separation of a signal current and a supply current for use with remotely fed intermediate regenerators or repeaters of broad-band transmission systems having connection cables connected to the diplexer, comprising:

an inductor means for supplying current from the connection cable to the regenerator or repeater and a capacitor which connects a current supply terminal of the regenerator or repeater to a reference potential of the regenerator or repeater;

a homogeneous line with an intrinsic impedance corresponding to that of the connection cable connected thereto;

inner and outer conductors of the homogeneous line being connected at one end of the line to corresponding conductors of the connection cable and at the other end of the line, the inner conductor being coupled to a signal terminal of the regenerator or repeater;

an inhomogenous line;

the outer conductor of the homogenous line being connected to an inner conductor of the inhomogenous line;

the inhomogenous line having alternating sections of low and high intrinsic impedance in comparison to the connection cable;

a terminal of an outer conductor of the inhomogeneous line adjacent to the connection cable being conductively connected with a shielding of the diplexer; and another terminal of the outer conductor at an opposite end of the inhomogeneous line being connected to said reference potential of the regenerator or repeater.

2. A diplexer according to claim 1 wherein the homogeneous line is formed by a part of the connection cable.

3. A diplexer according to claim 1 wherein the homogeneous line is formed by a stripline arrangement.

4. A diplexer according to claim 1 wherein the inhomogenous line is formed by a high-voltage-stable tubular body through which the homogeneous line is guided; the tubular body is shaped from a material with a high dielectrical constant; the tubular body has a metallization on the inside, said metallization representing the inner conductor of the inhomogeneous line; and the tubular body having an outer metallization which is interrupted by at least one ferrite ring and which at least partially forms the outer conductor of the inhomogeneous line.

5. A diplexer according to claim 4 wherein a shielding housing having a conductive connection to the outer metallization of the inhomogeneous line is provided, said shielding circumferentially surrounding the tubular body over at least a part of its length, and said shielding housing forming in conjunction with the ferrite ring the outer conductor of the high impedance sections of the inhomogeneous line.

6. A diplexer according to claim 1 wherein at least one line inductor directly connects to the connection cable.

7. A diplexer according to claim 6 wherein the line inductor is formed by means of an additional ferrite ring which is slipped over a free part of the connection cable directly adjacent to the tubular body at the side facing away from the regenerator or repeater.

8. A diplexer according to claim 1 wherein the reference potential of the regenerator or repeater is connected to a reference potential of the connection cable over a series oscillatory circuit tuned to a preselected frequency.

9. A diplexer according to claim 4 wherein a length of a respective section of the outer metallization of the tubular body is selected in such a manner that a resulting resonant frequency occurs in a frequency range in which a transmission signal of the diplexer exhibits relatively low energy.

10. A diplexer according to claim 4 wherein an overall length of the outer metallization is selected in such a manner that a sum capacitance of the low impedance sections of the inhomogeneous line deriving at low frequencies, together with effective inductances, produce a lower cutoff frequency of the diplexer corresponding to a lower cutoff frequency of the signals to be transmitted.

11. A diplexer according to claim 4 wherein a length of one of the sections of the tubular body outer metallization interrupted by a ferrite ring is selected in such a manner that a resulting resonant frequency is higher by approximately a factor of 2 than a resonant frequency determined by a length not interrupted by a ferrite ring.

12. A diplexer for separation of a signal current and a supply current being fed to a regenerator or repeater connected to a connection cable of a broad-band transmission system, comprising:

a homogeneous line having an inner conductor and an outer conductor;

an inner conductor of the homogeneous line connecting at one end to an inner conductor of the connection cable and at the other end through inductance means to a current supply terminal of the regenerator or repeater and also through a coupling capacitor to a signal terminal of the regenerator or repeater;

an inhomogeneous line having an outer conductor and an inner conductor;

the outer conductor of the homogeneous line connecting between an outer conductor of the input cable and one end of an inner conductor of the inhomogeneous line, the other end of the inner conductor of the inhomogeneous line connecting to the outer conductor of the input cable;

the outer conductor of the inhomogenous line being connected at one end to a shielding of the diplexer and at the other end to a reference potential of the regenerator or repeater; and the inhomogeneous line having alternating sections of low and high intrinsic impedance in comparison to an impedance of the connection cable.

13. A diplexer according to claim 12 wherein a capacitor is connected between a current supply terminal of the regenerator or repeater and the reference potential thereof.

14. A diplexer according to claim 12 wherein the homogeneous line runs through a central core of the inhomogeneous line, the inhomogeneous line being formed of a tubular body with means for creating high impedance at specific locations along the tubular body.

* * * * *